United States Patent
Song et al.

(10) Patent No.: US 9,190,541 B2
(45) Date of Patent: Nov. 17, 2015

(54) ANTIREFLECTION COATING USING SELF-ASSEMBLY NANO STRUCTURE AND MANUFACTURE METHOD THEREOF

(71) Applicant: KOREA INSTITUTE OF SCIENCE AND TECHNOLOGY, Seoul (KR)

(72) Inventors: Jin-Dong Song, Seoul (KR); Eunhye Lee, Seoul (KR); Min Hwan Bae, Chungcheongnam-do (KR); Won Jun Choi, Seoul (KR); Jae Jin Yoon, Incheon (KR); Il Ki Han, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 20 days.

(21) Appl. No.: 13/906,618

(22) Filed: May 31, 2013

(65) Prior Publication Data

US 2014/0217441 A1    Aug. 7, 2014

(30) Foreign Application Priority Data

Feb. 4, 2013   (KR) ........................ 10-2013-0012165

(51) Int. Cl.
  *H01L 33/00*    (2010.01)
  *H01L 31/0216*  (2014.01)
  *H01L 33/44*    (2010.01)

(52) U.S. Cl.
  CPC ........... *H01L 31/02168* (2013.01); *H01L 33/44* (2013.01)

(58) Field of Classification Search
  CPC ................. H01L 21/02639; H01L 21/02395; H01L 21/02546; H01L 29/127; H01L 29/66439; H01L 29/7613; H01L 21/02458; H01L 21/0254; H01L 21/0265; H01L 31/0735; H01L 31/1856; H01L 33/007; H01L 33/12
  See application file for complete search history.

(56) References Cited

U.S. PATENT DOCUMENTS

| | | | |
|---|---|---|---|
| 2002/0017650 A1* | 2/2002 | Nikolaev et al. | 257/82 |
| 2007/0209576 A1 | 9/2007 | Sunkara et al. | |
| 2008/0001167 A1* | 1/2008 | Coe-Sullivan et al. | 257/146 |
| 2009/0050204 A1 | 2/2009 | Habib | |
| 2010/0126570 A1* | 5/2010 | Kizilyalli et al. | 136/255 |
| 2010/0243053 A1* | 9/2010 | Coe-Sullivan et al. | 136/259 |
| 2012/0160312 A1* | 6/2012 | Arakawa et al. | 136/255 |

FOREIGN PATENT DOCUMENTS

| | | |
|---|---|---|
| KR | 100861763 B1 | 9/2008 |
| KR | 100966377 B1 | 6/2010 |
| KR | 101067345 B1 | 9/2011 |
| KR | 1020120121629 A | 11/2012 |

OTHER PUBLICATIONS

C. Somaschini, et al; "Self-assemble GaAs/AlGaAs coupled quantum ring-disk structures by droplet epitaxy", Nanotechnology, vol. 21, pp. 1-5 Published Feb. 25, 2010.

* cited by examiner

*Primary Examiner* — Robert Bachner
(74) *Attorney, Agent, or Firm* — Ladas & Parry LLP

(57) ABSTRACT

In an aspect of the present disclosure, there is disclosed a manufacture method of an antireflection coating using a self-assembly nano structure, which includes forming a first metal droplet on a substrate by means of droplet epitaxy, depositing a first non-metal on the formed first metal droplet, and forming a first nano compound crystal by means of self-assembly of the deposited first non-metal and the first metal droplet.

20 Claims, 7 Drawing Sheets

ANTIREFLECTION COATING USING SELF-ASSEMBLY NANO STRUCTURE AND MANUFACTURE METHOD THEREOF

CROSS-REFERENCE TO RELATED APPLICATION

This application claims priority to Korean Patent Application No. 10-2013-0012165, filed on Feb. 4, 2013, and all the benefits accruing therefrom under 35 U.S.C. §119, the contents of which in its entirety are herein incorporated by reference.

BACKGROUND

1. Field

The present disclosure relates to a manufacture method of an antireflection coating, and more particularly, to a manufacture method of an antireflection coating using a self-assembly nano structure.

2. Description of the Related Art

Recently, in the fields of solar cells and light emitting diodes (LED), the importance of an antireflection coating is being emphasized in relation to the efficiency of photoelectric devices and is being actively studied. At an early stage of the study, the antireflection coating has a film shape with a step index, but the antireflection coating of such a film shape has a narrow wavelength range at a non-reflecting portion and allows non-reflection only within a limited incident angle.

In order to solve the above problems, an antireflection coating with a graded index has been studied. If an antireflection coating having a nano structure instead of a film shape is formed, a graded index is formed, which allows the formation of an antireflection coating capable of effectively confining and absorbing light. The graded index antireflection coating may be manufactured in the form of a nano wire, a nano tip, a nano rod, a nano cone, a nano dome or the like.

However, the antireflection coating having a graded index also has a problem since most processes need etching. Defects occurring in the etching process may interfere with absorption of light in the main active layer in a lower portion (in case of a solar cell) and hinder light emission to the lower active layer in LEDs Therefore, the device efficiency is reduced accordingly.

SUMMARY

The present disclosure is directed to providing a manufacture method of an antireflection coating having a nano structure, which does not use an etching process.

In one aspect of the present disclosure, there is provided a manufacture method of an antireflection coating using a self-assembly nano structure, which includes: forming a first metal droplet on a substrate by means of droplet epitaxy; depositing a first non-metal on the formed first metal droplet; and forming a first nano compound crystal by means of self-assembly of the deposited first non-metal and the first metal droplet.

The first metal droplet may be at least one selected from gallium, phosphorus and aluminum.

The first non-metal may be at least one selected from arsenic, antimony, phosphorus and nitrogen.

The forming of a first metal droplet on a substrate by means of droplet epitaxy may include controlling a height or an aspect ratio of the formed first metal droplet by adjusting a growth temperature of the first metal droplet.

The forming of a first metal droplet on a substrate by means of droplet epitaxy may include controlling a height or a diameter of the formed first metal droplet by adjusting coverage of the first metal droplet.

The forming of a first metal droplet on a substrate by means of droplet epitaxy may include controlling at least one of a density, a height and an aspect ratio of the formed first metal droplet by adjusting a growth rate of the first metal droplet.

In the depositing of a first non-metal on the formed first metal droplet, the first non-metal may be deposited on the first metal droplet at a normal temperature, and the first metal droplet may be in a liquid state.

In the depositing of a first non-metal on the formed first metal droplet, a temperature of the substrate and an injection time and an injection amount of the first non-metal may be adjusted to control a shape of the first nano compound crystal.

The shape of the first nano compound crystal may include at least one of a large nano dome, a nano tip, a nano rod and a nano cone.

The substrate may be an N-type semiconductor compound layer or include an N-type semiconductor compound layer.

In the forming of a first nano compound crystal, a density of the first metal droplet may be adjusted to control a density of the first nano compound crystal.

The manufacture method may further include: forming a second metal droplet on the first nano compound crystal by means of droplet epitaxy; depositing a second non-metal on the formed second metal droplet; and forming a second nano compound crystal by means of self-assembly of the deposited second non-metal and the second metal droplet.

The second nano compound crystal may be formed on the first nano compound crystal as a layer.

The first nano compound crystal and the second nano compound crystal may be formed in a mixed structure on the same plane.

In another aspect of the present disclosure, there is provided an antireflection coating using a self-assembly nano structure, which includes: a substrate; and a nano compound crystal located on the substrate, wherein the nano compound crystal may be formed by means of self-assembly of a metal droplet formed by droplet epitaxy and a non-metal.

The metal droplet may be at least one selected from gallium, phosphorus and aluminum.

The non-metal may be at least one selected from arsenic, antimony, phosphorus and nitrogen.

The shape of the nano compound crystal may include at least one of a large nano dome, a nano tip, a nano rod and a nano cone.

According to the present disclosure, since a self-assembly process is used, an etching process may be excluded, which eliminates any defect caused by etching. In addition, a nano structure may be formed by means of droplet epitaxy, regardless of substrate materials, and a high-quality photoelectric device may be produced since an antireflection coating is manufactured under a high vacuum.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Hereinafter, embodiments of the present disclosure will be described in detail with reference to the accompanying drawings.

Figure 1A:
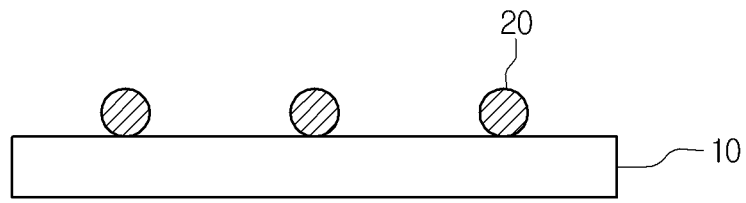
FIGS. 1a to 1c are plane views showing a manufacture method of an antireflection coating using a self-assembly nano structure according to the present disclosure.
Figure 1B:
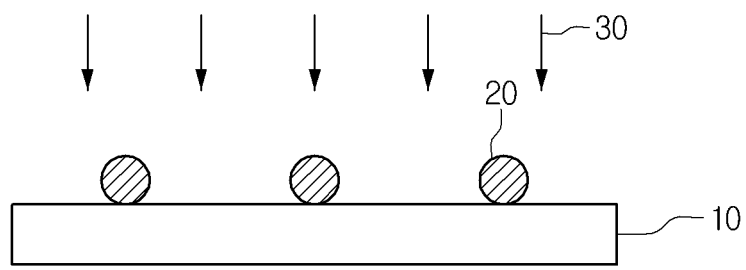
Figure 1C:
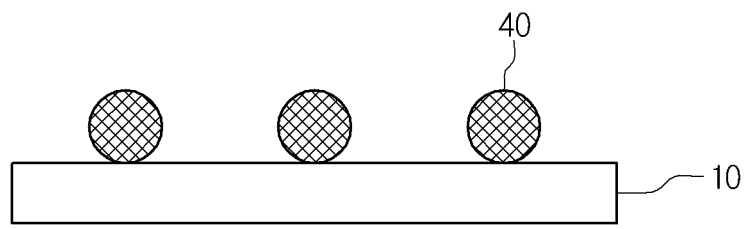

FIGS. 1a to 1c are plane views showing a manufacture method of an antireflection coating using a self-assembly nano structure according to the present disclosure.

A manufacture method of an antireflection coating using a self-assembly nano structure according to an embodiment of the present disclosure includes forming a first metal droplet on a substrate by means of droplet epitaxy, depositing a first non-metal on the formed first metal droplet, and forming a first nano compound crystal by means of self-assembly of the deposited first non-metal and the first metal droplet.

Referring to FIG. 1a, a metal droplet 20 is formed on a substrate 10. The metal droplet 20 may be formed on the substrate 10 by means of droplet epitaxy. The metal droplet 20 may have a large dome shape (quantom dot) structure formed by droplet epitaxy. For example, the droplet epitaxy may be performed in an ultra-high vacuum state of $2\ e^{-9}$ Torr or below.

The droplet epitaxy is a method capable of thoroughly separating Group III materials and Group V materials and growing them on a substrate. Since lattice mismatching may not be taken into consideration, different from a general Stranski-Krastanow (SK) method, the droplet epitaxy allows manufacture of a large nano structure, an ultra low density nano structure, or nano structures of various shapes.

Referring to FIG. 1b, a non-metal 30 is deposited on the formed metal droplet 20. The non-metal 30 may be deposited by means of molecular beam epitaxy (MBE). In an embodiment, the non-metal 30 may be deposited to the substrate 10 at a normal temperature for 2 to 3 minutes. In addition, when the non-metal 30 is deposited, the metal droplet 20 may be crystallized.

Referring to FIG. 1c, a nano compound crystal 40 formed by means of self-assembly of the deposited non-metal 30 and the metal droplet 20 is shown. The shape and size of the nano compound crystal 40 may be controlled according to an injection amount or an injection time of the non-metal 30 or a temperature of the substrate. In other words, the shape and size of the nano compound crystal may be controlled minutely by changing at least one of a flux and an injection of the non-metal. For example, the shape of the nano compound crystal may be controlled by injecting As at $1.2\ e^{-7}$ Torr for 10 minutes as a non-metal and then injecting at $6\ e^{-6}$ Torr for 2 minutes.

In addition, the shape of the nano compound crystal 40 may be at least one of a nano dome, a nano tip, a nano rod or a nano cone.

In an embodiment, the metal droplet 20 and the non-metal 30 may any Group III or Group V materials which form Groups III-V compound semiconductors. The metal droplet 20 may be gallium (Ga), and the non-metal 30 may be at least one material selected from arsenic (As), antimony (Sb), phosphorus (P) and nitrogen (N).

For example, if the metal droplet 20 is gallium and the non-metal 30 is arsenic, the nano compound crystal 40 may be gallium arsenic islands (GaAs islands). In this case, when arsenic is deposited, gallium may be in a liquid state, and arsenic may be deposited by using a MBE instrument.

Figure 2:
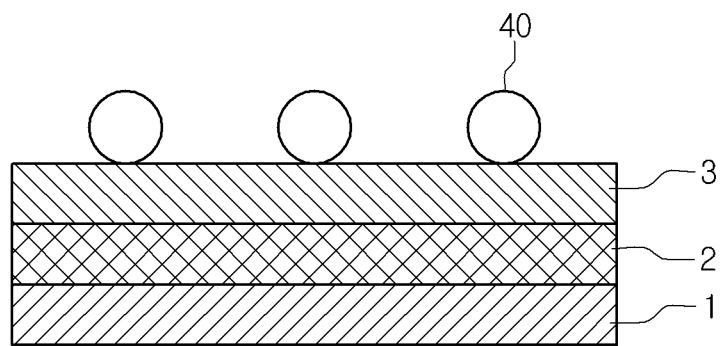
FIG. 2 is a cross-sectional view showing a substrate according to another embodiment of the present disclosure.

FIG. 2 is a cross-sectional view showing a substrate according to another embodiment of the present disclosure. In the present disclosure, the substrate 10 may be any semiconductor substrate. For example, as shown in FIG. 2, the substrate 10 may include an N-type gallium arsenic layer (N—GaAs layer) 1, a gallium arsenic buffer layer 2 and an aluminum gallium arsenic layer ($Al_{0.3}Ga_{0.7}As$, 50 nm). In this example, in the substrate 10, $As_4$ may be injected onto the N—GaAs layer 1 at 600° C. when removing oxides, and the GaAs buffer layer 2 with a thickness of 100 nm and the aluminum gallium arsenic layer 3 with a thickness of 50 nm may be formed. However, the substrate 10 described in the present disclosure is not limited thereto.

As described above, the nano compound crystal 40 formed on the substrate 10 by means of self-assembly may be used for a solar cell or a light emitting element as an antireflection coating. When determining reflectance of the antireflection coating according to an embodiment of the present disclosure, the size and density of the nano compound crystal 40 are important factors and need to be controlled.

Figure 3A:
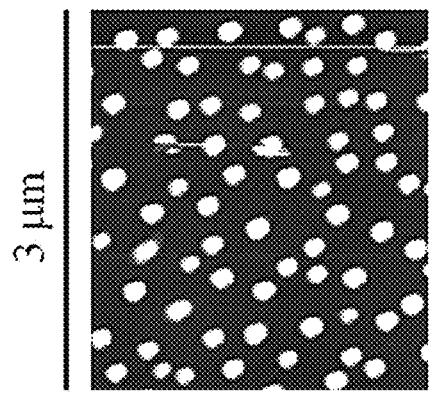
FIGS. 3a and 3b are an AFM image and a SEM image showing a Ga droplet formed on the substrate according to an embodiment of the present disclosure.
Figure 3B:
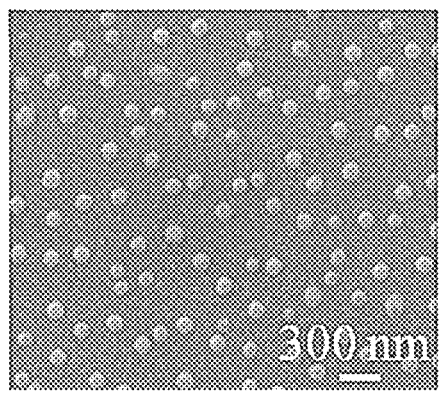

FIGS. 3a and 3b are an AFM image and a SEM image showing a Ga droplet formed on the substrate according to an embodiment of the present disclosure. The Ga droplet of FIGS. 3a and 3b has a diameter of about 153 nm, a height of about 41 nm, and a density of about 9 droplets/$um^2$. Generally, if arsenic is injected in this state, only the height increases about twice. Therefore, the diameter and the density of the gallium arsenic islands do not change, and the height may become about 80 nm.

In detail, since the formation of the nano compound crystal typically depends on the formation of the metal droplet, it is possible to predict and produce an appropriate antireflection coating by adjusting conditions of the metal droplet 20 before depositing the non-metal.

Hereinafter, the change of a state of the metal droplet will be described by using gallium as a metal droplet and arsenic as a non-metal. However, gallium and arsenic are just examples of the present disclosure, and the present disclosure is not limited thereto.

Figure 5A:
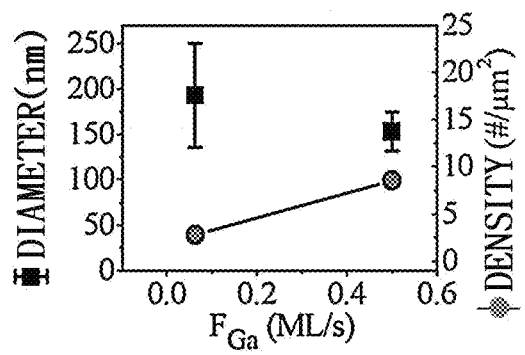
FIGS. 5a and 5b are graphs showing the changes of a diameter, a density, a height and an aspect ratio of the Ga droplet according to the change of a growth rate $F_{G}a$ of gallium.
Figure 5B:
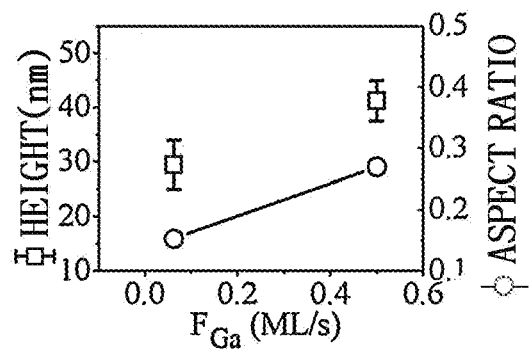
Figure 6:
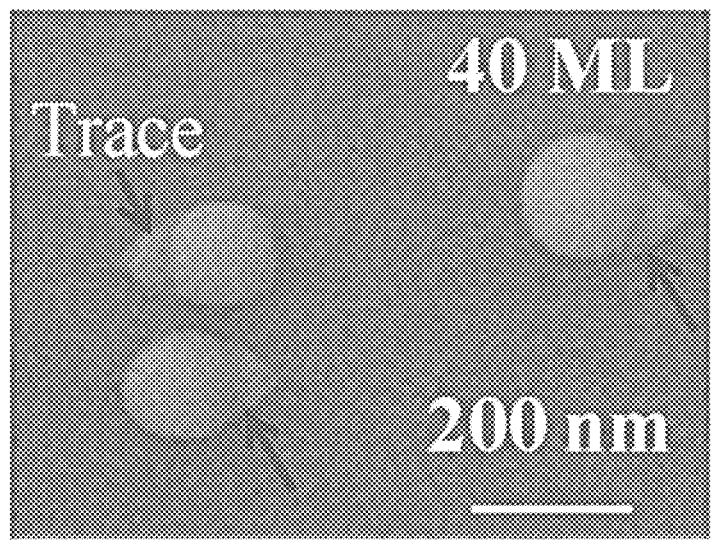
FIG. 6 is a SEM image showing the surface of a Ga droplet under the condition where gallium coverage is 40 ML.

FIGS. 4 to 6 are graphs showing analysis results of the surface of the Ga droplet, obtained from SEM and AFM. The diameter of the metal droplet was analyzed by using a SEM image, and the height of the metal droplet was analyzed by using an AFM image.

Figure 4A:
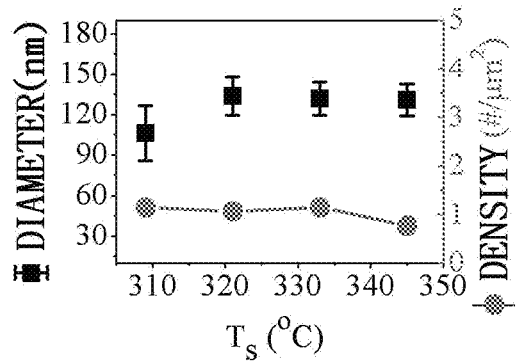
FIGS. 4a and 4b are graphs showing the changes of a diameter, a density, a height and an aspect ratio of the Ga droplet according to a growth temperature Ts.
Figure 4B:
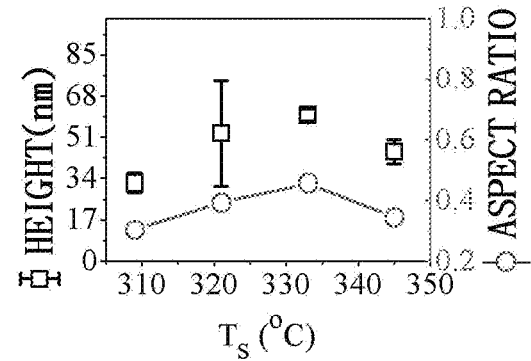

FIGS. 4a and 4b are graphs showing the changes of a diameter, a density, a height and an aspect ratio of the Ga droplet according to a growth temperature Ts. In FIGS. 4a and 4b, the changes of a diameter, a density or the like are shown in a state where the coverage of gallium is fixed to 10 ML and a growth rate is fixed to 0.0625 ML/s.

Referring to FIG. 4a, the density and diameter of the Ga droplet do not greatly change according to temperature, but referring to FIG. 4b, the height and aspect ratio (height/diameter) greatly change. In addition, the height and aspect ratio increase till about 335° C. and then decrease. Therefore, under this condition, the growth temperature has a close relation with the height and aspect ratio of the Ga droplet.

Figure 4C:
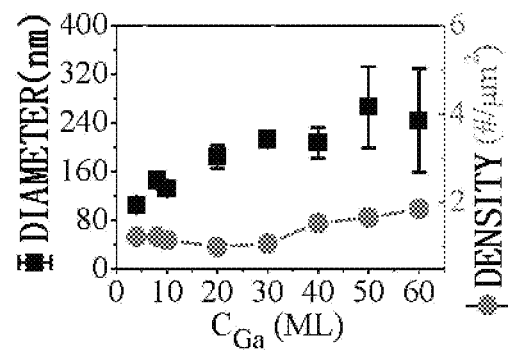
FIGS. 4c and 4d are graphs showing the changes of a diameter, a density, a height and an aspect ratio of the Ga droplet according to coverage $C_{G}a$ of the Ga droplet.
Figure 4D:
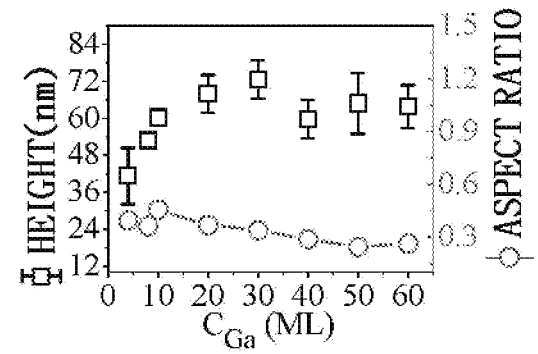

FIGS. 4c and 4d are graphs showing the changes of a diameter, a density, a height and an aspect ratio of the Ga droplet according to coverage $C_G a$ of the Ga droplet. At this time, the growth temperature is fixed to 333° C., and the growth rate is fixed to 0.0625 ML/s. Referring to FIG. 4c, the density does not change according to the change of coverage, but the diameter tends to increase in a predetermined coverage region according to the increase of coverage. In addition, the diameter shows an abrupt increase of an error range when the coverage is 40 ML or above. Referring to FIG. 4d, the height increases till the coverage of 30 ML and then decreases. In other words, this represents that the shape of the metal droplet changes under a growth condition where the coverage is 40 ML or above.

FIGS. 5a and 5b are graphs showing the changes of a diameter, a density, a height and an aspect ratio of the Ga droplet according to the change of a growth rate $F_G a$ of gallium. In FIGS. 5a and 5b, the growth temperature is fixed to 297° C., and the coverage is fixed to 30 ML.

Referring to FIGS. 5a and 5b, if the gallium growth rate increases from 0.0625 ML/s to 0.5 ML/s, the density, height and aspect ratio increase and the diameter decreases. In addition, in the case the metal droplet has a growth rate of 0.0625 ML/s, the error range of diameter is greater than the case where the growth rate is 0.5 ML/s. This difference in error range is caused by the formation of a trace, and the increase of a growth time resulting from the low growth rate may be one of factors.

FIG. 6 is a scanning electron microscope (SEM) image showing the surface of a Ga droplet under the condition where gallium coverage is 40 ML. In FIG. 6, the shape of the Ga droplet has changed due to a trace, and the increase of a growth time according to the increase of gallium coverage may be one of factors for the occurrence of such a trace. However, the density and aspect ratio of the metal droplet have not been greatly affected by the coverage.

Figure 7A:
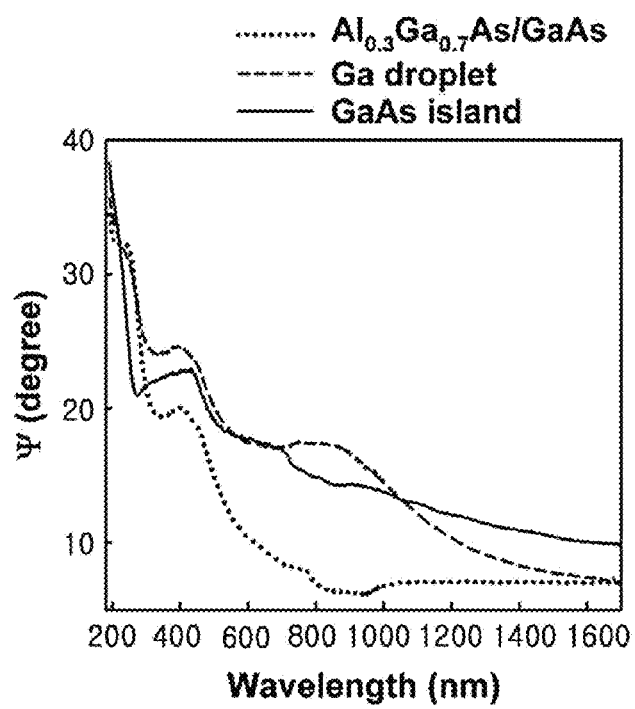
FIGS. 7a and 7b are graphs showing results monitored by in-situ ellipsometry for a process of forming a gallium arsenic nano compound crystal by depositing arsenic on the metal droplet of FIG. 3.
Figure 7B:
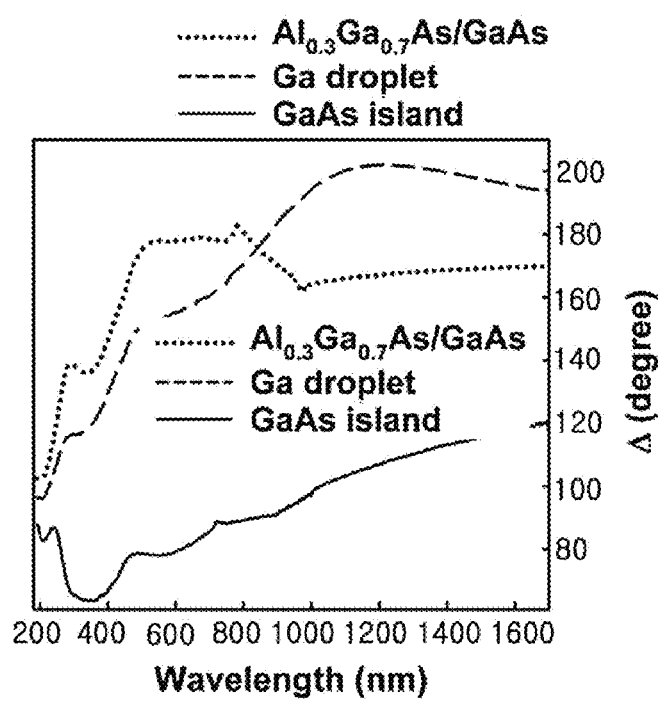

FIGS. 7a and 7b are graphs showing monitoring results for a process of forming a gallium arsenic nano compound crystal by depositing arsenic on the metal droplet of FIG. 3. In detail, FIGS. 7a and 7b are results obtained by measuring a surface of a substrate ($Al_{0.3}Ga_{0.7}As$, 50 nm), a surface where a Ga droplet is formed and a surface where a gallium arsenic nano compound crystal (GaAs islands) is formed, at an incident angle of 70° by means of in-situ spectroscopic ellipsometry in order to check the decrease of reflectance caused by the gallium arsenic nano compound crystal.

In FIGS. 7a and 7b, ψ and Δ are factors defined by an ellipsometry equation as shown below. ψ represents a size ratio of reflection coefficients possessed by P wave and S wave after reflection, and Δ represents a difference of phases possessed by P wave and S wave, incident with the same phase, after reflection.

The ellipsometry equation is defined like Equation 1 below.

$$\rho = \frac{r_p}{r_s} = \tan\psi e^{i\Delta} \qquad \text{Equation 1}$$

where ρ is a complex reflection coefficient ratio for reflection coefficients of P wave and S wave.

Figure 7C:
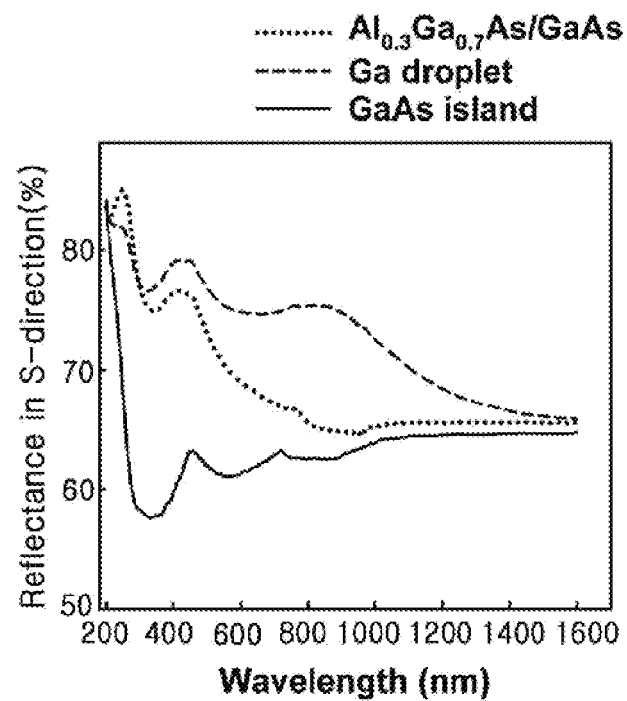
FIGS. 7c and 7d are graphs obtained by converting measurement values of FIGS. 7a and 7b into reflectance in the s-polarization and the p-polarization, respectively.
Figure 7D:
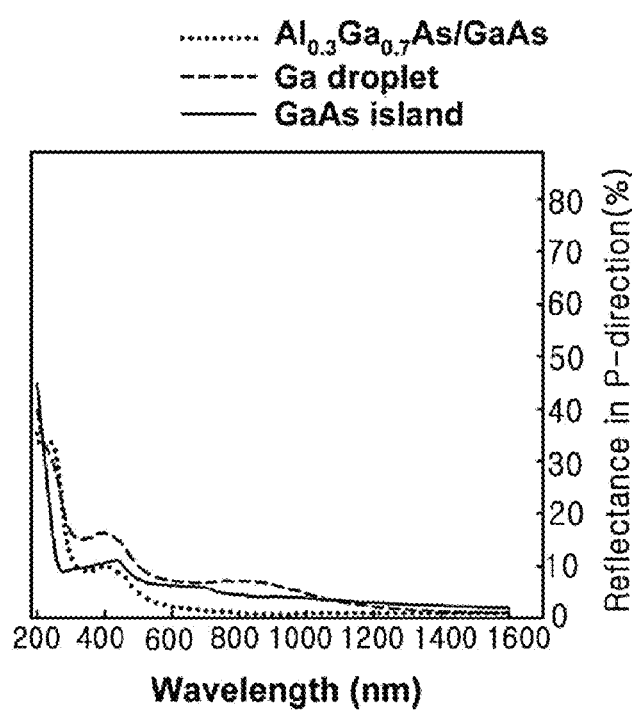

FIGS. 7c and 7d are graphs obtained by converting measurement values of FIGS. 7a and 7b into reflectance in the s-polarization and the p-polarization respectively. Referring to FIG. 7c, regarding the reflectance in the s-polarization, results at the surface of the substrate ($Al_{0.3}Ga_{0.7}As$, 50 nm), the surface where a Ga droplet is formed and the surface where a gallium arsenic nano compound crystal (GaAs islands) is formed are greatly different from each other. Meanwhile, referring to FIG. 7d, the reflectance in the p-polarization is not greatly different at the substrate ($Al_{0.3}Ga_{0.7}As$, 50 nm), the surface where a Ga droplet is formed and the surface where a gallium arsenic nano compound crystal (GaAs islands) is formed.

The results of of FIGS. 7c and 7d show that there is no significant change of the reflectance of p-polarization in FIG. 7d, compared to the results of of FIG. 7c. The results in in FIG. 7d are attributed to incidence of light at 70° near Brewster angle. Therefore, the great change at each surface of FIG. 7c in the s-polarization means that the formation of a gallium arsenic nano compound crystal gives a great influence on the reflectance. In other words, the reflectance of the surface where the gallium arsenic nano compound crystal is formed is reduced by about 2 to 20% in comparison to the surface of the substrate ($Al_{0.3}Ga_{0.7}As$, 50 nm) because the change of index is close to a linear pattern due to the structural characteristic of the gallium arsenic nano compound crystal.

Since a high-density large nano structure is demanded as the antireflection coating, the density of the metal droplet may be increased in order to increase the density of the nano compound crystal in the antireflection coating of the present disclosure. As described above, this is because the density of the metal droplet is proportional to the density of the nano compound crystal. In detail, the density of the Ga droplet may be increased by changing a growing condition such as growth temperature, gallium coverage or the like.

Figure 8A:
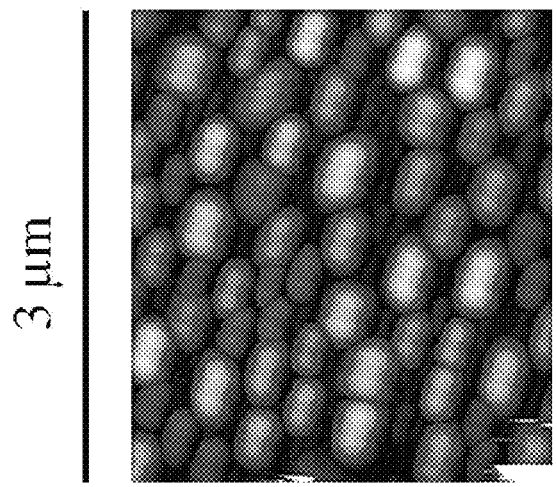
FIGS. 8a and 8b are an AFM image (FIG. 8a) and a SEM image (FIG. 8b) of a high-density Ga droplet.
Figure 8B:
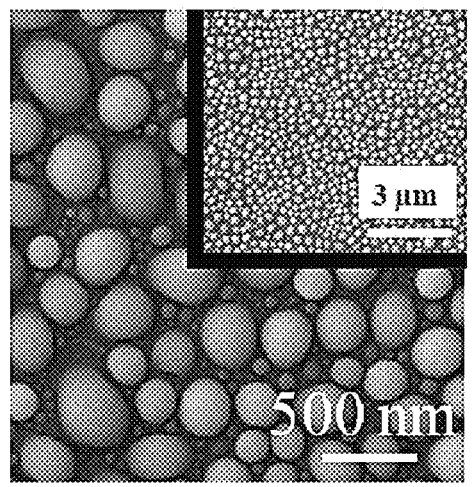
Figure 9:
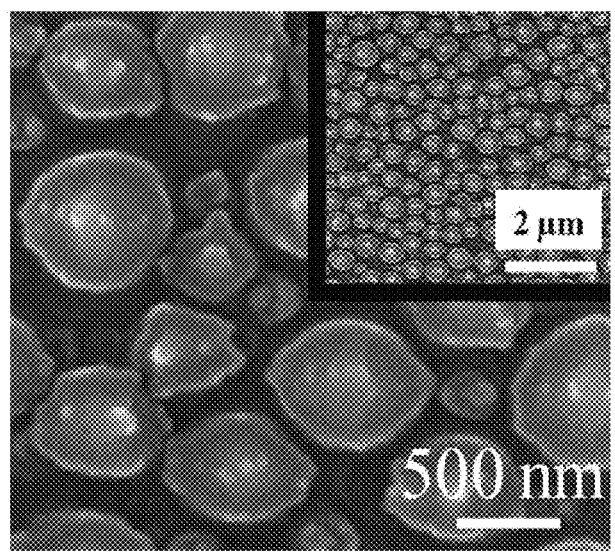
FIG. 9 is a SEM image of a large GaAs nano structure formed by injecting $As_4$ into the high-density Ga droplet.

FIGS. 8a and 8b are an AFM image (FIG. 8a) and a SEM image (FIG. 8b) of a high-density Ga droplet. In addition, FIG. 9 is a SEM image of such a GaAs nano structure.

In FIGS. 8a and 8b, the Ga droplet has a diameter of about 100 nm to 400 nm, a height of about 70 nm to 100 nm, and a density of about 60 droplet/um$^2$. If the Ga droplet reacts with arsenic, in general cases, the density does not change greatly but the height increases. Therefore, a gallium arsenic nano compound crystal having a height of about 140 nm to 200 nm may be formed.

Since the density of the Ga droplet shown in FIGS. 8a and 8b is higher than the density of the Ga droplet shown in FIGS. 3a and 3b, the reflectance of the antireflection coating (the antireflection coating of FIG. 9) manufactured by means of self-assembly of the metal droplet shown in FIGS. 8a and 8b and arsenic will be lower than the reflectance of the antireflection coating manufactured by using the Ga droplet of FIGS. 3a and 3b. In other words, the reflectance of the antireflection coating may be controlled by adjusting conditions of the gallium arsenic nano compound crystal.

In another embodiment, the manufacture method of an antireflection coating using a self-assembly nano structure may further include forming a second metal droplet on the first nano compound crystal by means of droplet epitaxy, depositing a second non-metal on the formed second metal droplet, and forming a second nano compound crystal by means of self-assembly of the deposited second non-metal and the second metal droplet.

In detail, a process of forming an additional nano compound crystal by forming a metal droplet on the nano compound crystal 40 by means of droplet epitaxy and depositing a non-metal thereto to induce a self-assembly reaction so that another nano compound crystal is formed may be further executed.

The process of forming an additional nano compound crystal as described above may be executed several times, and the added metal droplet and non-metal may be any Groups III-V compounds as described above. In addition, the additional nano compound crystal may be formed as a layer on the nano compound crystal 40 formed in advance, or two crystals may form a mixed structure on the same plane. For example, GaAs and GaSb nano compound crystals may be mixed on the same semiconductor substrate.

In other words, an antireflection coating using a self-assembly nano structure may be manufactured by using the above manufacture method. This antireflection coating includes a substrate and a nano compound crystal located on the substrate, and the nano compound crystal is formed by self-assembly of a metal droplet formed by droplet epitaxy and a non-metal. In addition, the metal droplet may be at least one selected from gallium, phosphorus and aluminum, and the non-metal may be at least one selected from arsenic, antimony, phosphorus and nitrogen. Moreover, the shape of the nano compound crystal may be at least one of a large nano dome, a nano tip, a nano rod and a nano cone.

The reflection property of the nano compound crystal having a GaAs island structure described as an embodiment in this specification shows that the nano structure is available as an antireflection coating or an absorbing body of a photoelectric device. In addition, the reflectance may be reduced in a wavelength range wider than the above by adjusting the nano structure.

Moreover, according to an aspect of the present disclosure, if the antireflection coating formed by self-assembly is formed at the upper portion of a photoelectric device such as a solar cell or an LED, an optical absorption factor or an optical emission factor may be maximized by reducing the optical absorption of the antireflection coating and transferring a greater amount of light to the active layer or to the outside.

Though the present disclosure has been described based on the embodiments depicted in the drawings, it will be understood by those skilled in the art that it is just an example and various changes and modifications can be made thereto. However, such changes and modifications should be regarded as being included within the scope of the present disclosure. Therefore, the scope of the present disclosure should be decided based on the technical spirit of the appended claims.

What is claimed is:

1. A manufacture method of an antireflection coating using a self-assembly nano structure, comprising:
    forming a first metal droplet comprising aluminum on a substrate by means of droplet epitaxy;
    depositing a first non-metal on the formed first metal droplet, wherein the first non-metal is selected from the group consisting of antimony, phosphorus, and nitrogen; and
    forming a first nano compound crystal by means of self-assembly of the deposited first non-metal and the first metal droplet.

2. The manufacture method of an antireflection coating using a self-assembly nano structure according to claim 1, wherein the first metal droplet further comprises phosphorus.

3. The manufacture method of an antireflection coating using a self-assembly nano structure according to claim 1, wherein the first non-metal comprises antimony.

4. The manufacture method of an antireflection coating using a self-assembly nano structure according to claim 1, wherein said forming of a first metal droplet on a substrate by means of droplet epitaxy includes:
    controlling a height or an aspect ratio of the formed first metal droplet by adjusting a growth temperature of the first metal droplet.

5. The manufacture method of an antireflection coating using a self-assembly nano structure according to claim 1, wherein said forming of a first metal droplet on a substrate by means of droplet epitaxy includes:
    controlling a height or a diameter of the formed first metal droplet by adjusting coverage of the first metal droplet.

6. The manufacture method of an antireflection coating using a self-assembly nano structure according to claim 1, wherein said forming of a first metal droplet on a substrate by means of droplet epitaxy includes:
    controlling at least one of a density, a height and an aspect ratio of the formed first metal droplet by adjusting a growth rate of the first metal droplet.

7. The manufacture method of an antireflection coating using a self-assembly nano structure according to claim 1, in said depositing of a first non-metal on the formed first metal droplet,
    wherein the first metal droplet is in a liquid state.

8. The manufacture method of an antireflection coating using a self-assembly nano structure according to claim 1, in said depositing of a first non-metal on the formed first metal droplet,
    wherein a temperature of the substrate and an injection time and an injection amount of the first non-metal are adjusted to control a shape of the first nano compound crystal.

9. The manufacture method of an antireflection coating using a self-assembly nano structure according to claim 8, wherein the shape of the first nano compound crystal includes at least one of a nano dome, a nano tip, a nano rod and a nano cone.

10. The manufacture method of an antireflection coating using a self-assembly nano structure according to claim 1, wherein the substrate is an N-type semiconductor compound layer or includes an N-type semiconductor compound layer.

11. The manufacture method of an antireflection coating using a self-assembly nano structure according to claim 1, in said forming of a first nano compound crystal,
    wherein a density of the first metal droplet is adjusted to control a density of the first nano compound crystal.

12. The manufacture method of an antireflection coating using a self-assembly nano structure according to claim 1, further comprising:
    forming a second metal droplet on the first nano compound crystal by means of droplet epitaxy;
    depositing a second non-metal on the formed second metal droplet; and
    forming a second nano compound crystal by means of self-assembly of the deposited second non-metal and the second metal droplet.

13. The manufacture method of an antireflection coating using a self-assembly nano structure according to claim 12, wherein the second nano compound crystal is formed on the first nano compound crystal as a layer.

14. The manufacture method of an antireflection coating using a self-assembly nano structure according to claim 12, wherein the first nano compound crystal and the second nano compound crystal are formed in a mixed structure on the same plane.

15. An antireflection coating using a self-assembly nano structure, comprising:
   a substrate comprising:
      an N—GaAs layer;
      a gallium arsenic buffer layer on the N—GaAs layer; and
      an aluminum gallium arsenic layer on the gallium arsenic buffer layer; and
   a first nano compound crystal located on the substrate,
   wherein the first nano compound crystal is formed by means of self-assembly of a metal droplet comprising aluminum formed by droplet epitaxy and a non-metal.

16. The antireflection coating using a self-assembly nano structure according to claim 15, wherein the metal droplet further comprises gallium.

17. The antireflection coating using a self-assembly nano structure according to claim 15, wherein the non-metal is at least one selected from arsenic, antimony, phosphorus and nitrogen.

18. The antireflection coating using a self-assembly nano structure according to claim 15, wherein the shape of the first nano compound crystal includes at least one of a nano dome, a nano tip, a nano rod and a nano cone.

19. The antireflection coating using a self-assembly nano structure according to claim 15, further comprising a second nano compound crystal on the substrate, wherein the second nano compound crystal comprises GaSb.

20. A manufacture method of an antireflection coating using a self-assembly nano structure, comprising:
   forming a first metal droplet comprising phosphorous on a substrate by means of droplet epitaxy;
   depositing a first non-metal on the formed first metal droplet, wherein the first non-metal is selected from the group consisting of antimony, phosphorus, and nitrogen; and
   forming a first nano compound crystal by means of self-assembly of the deposited first non-metal and the first metal droplet.

* * * * *